United States Patent [19]
Stolmeijer et al.

[11] Patent Number: 5,939,766
[45] Date of Patent: *Aug. 17, 1999

[54] HIGH QUALITY CAPACITOR FOR SUB-MICROMETER INTEGRATED CIRCUITS

[75] Inventors: Andre Stolmeijer, Santa Clara; David C. Greenlaw, Portola Valley, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/687,128

[22] Filed: Jul. 24, 1996

[51] Int. Cl.$^6$ ..................................................... H01L 27/04
[52] U.S. Cl. .......................................... 257/534; 257/307
[58] Field of Search ..................................... 257/307, 532, 257/534

[56] References Cited

U.S. PATENT DOCUMENTS

| | | | |
|---|---|---|---|
| 5,208,725 | 5/1993 | Akcasu | 257/532 |
| 5,459,633 | 10/1995 | Kosslowski et al. | 257/532 |
| 5,583,359 | 12/1996 | Ng et al. | 257/532 |
| 5,589,709 | 12/1996 | Dobkin et al. | 257/532 |

*Primary Examiner*—Gene M. Munson
*Attorney, Agent, or Firm*—Sawyer & Associates

[57] ABSTRACT

A capacitor is provided for analog applications which can be fabricated with processes conventionally employed to fabricate digital circuitry and which has line spacing that is smaller than interlayer spacing. The capacitor of the present invention is based on intralayer capacitive coupling, rather than interlayer capacitive coupling which is conventionally employed in prior art capacitors. A capacitance can be achieved with the capacitor of the present invention that is higher than can be obtained with conventional capacitors occupying an area on the integrated circuit structure having similar size. Additionally, the capacitor of the present invention can be formed from upper metal layer such as metal-3, metal-4, and metal-5, and when the capacitor is formed from any of the upper metal layers the parasitic capacitance to ground is small.

18 Claims, 4 Drawing Sheets

HIGH QUALITY CAPACITOR FOR SUB-MICROMETER INTEGRATED CIRCUITS

TECHNICAL FIELD

The present invention relates generally to capacitors employed in integrated circuits (ICs) formed on semiconductor wafers. More particularly, the present invention relates to high quality capacitors for use in analog circuits which are formed by processes conventionally used to form digital circuitry.

BACKGROUND ART

Capacitors are conventionally employed in analog circuits. Capacitors are used in radios, cellular phones, in other RF (radio frequency) applications which require oscillator circuits, as well as in amplifier network ICs. Capacitors are not generally used in ICs dedicated solely to logic circuitry. Consequently, capacitors are less likely to be employed in digital circuits.

However, the majority of IC fabrication processes are dedicated to the fabrication of digital logic circuits. Accordingly, processes for fabricating digital circuitry are well developed. Advances in processing of digital circuitry have enabled significant improvements in miniaturization, operating speed, and packing density.

Since processes for fabricating digital circuitry are widespread, such processes are attractive for use in the fabrication of analog circuits. Accordingly, processes designed for fabricating digital circuitry are increasingly being employed to produce analog circuits. In particular, MOS (metal oxide semiconductor) transistors are being employed in analog circuits instead of bipolar junction transistors.

Typically, capacitors are produced on a semiconductor wafer by forming a p-n junction comprising p-doped and n-doped semiconductor regions. Such a capacitor formed from a p-n junction includes regions of doped semiconductor and associated depletion regions which are influenced by the application of an applied voltage. Consequently, these capacitors disadvantageously have a capacitance which varies with applied voltage.

Alternatively, capacitors may be produced on a semiconductor wafer by forming an MOS structure comprising a metal, a dielectric spacer, and doped semiconductor such as doped polysilicon or diffusion. Disadvantageously, a capacitor constructed using metal and polysilicon has a parasitic capacitance to ground which is larger than the capacitance of the MOS structure. A capacitor constructed using metal and diffusion has a parasitic capacitance to ground which varies with applied voltage.

A capacitor can also be created on a semiconductor wafer which is analogous to a parallel plate capacitor by forming two layers of metal wherein the layers of metal are separated by dielectric spacer. Advantageously, a capacitor comprising two layers of metal separated by a dielectric spacer has a capacitance which does not vary with applied voltage. Such a capacitor, however, has a parasitic capacitance to ground that is similar in magnitude to the capacitance between the two layers of metal.

Thus, there remains a need for a capacitor for analog applications which does not have a capacitance which varies with applied voltage, which has a parasitic capacitance to ground which is small, and which can be formed using fabrication processes conventionally employed to fabricate digital circuitry.

DISCLOSURE OF INVENTION

In accordance with the invention, a capacitor and method for producing same is provided which can be employed for analog applications but which is fabricated with processes conventionally employed to fabricate digital circuitry. The capacitor is formed on an insulating layer formed over a semiconductor substrate. The capacitor comprises a first layer of metal patterned to form:

(a) a plurality of first lines each having two ends and a length there-between;

(b) a first connecting electrode connected to one end of each of the first lines, each of the first lines electrically isolated except for the connection formed with the first connecting electrode;

(c) a plurality of second lines each having two ends and a length there-between arranged such the plurality of first lines and the plurality of second lines are inter-digitated; and (d) a second connecting electrode connected to one end of each of the second lines, each of the second lines electrically isolated except for the connection formed with the second connecting electrode.

The method of forming the capacitor of the present invention on an insulating layer formed over a semiconductor substrate comprises the steps of depositing the first layer of metal and patterning the first layer of metal to form the plurality of first lines, the first connecting electrode, the plurality of second lines, and the second connecting electrode described above.

The capacitor of the present invention is based on intralayer capacitive coupling between metal lines on a single metal layer, rather than interlayer capacitive coupling between two separate metal layers. In contrast, interlayer capacitive coupling is conventionally employed in prior art capacitors. With conventional digital circuitry having sub-micrometer feature sizes, the space between metal lines on a single metal layer is smaller than the spacing between two separate metal layers. Accordingly, for such sub-micrometer IC technology, the capacitance that can be achieved with the capacitor of the present invention, which employs intralayer capacitive coupling, is higher than can be obtained with conventional capacitors occupying the same area on a semiconductor wafer. Additionally, when the capacitor is formed from upper metal layers such as metal-3, metal-4, and metal-5, the parasitic capacitance to ground is small.

In the capacitor of the present invention, additional levels, each comprising a metal layer, may be employed to provide additional capacitance. Each additional layer of metal is separated by an additional insulating layer. For example, three or four layers of metal may be used to form the capacitor of the present invention.

Other objects, features, and advantages of the present invention will become apparent upon consideration of the following detailed description and accompanying drawings, in which like reference designations represent like features throughout the figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIG. 2A is a top plan view of the capacitor, while FIG. 2B is a cross-sectional view taken along the line 2b—2b of FIG. 2A;

FIGS. 3A and 3B are top plan views of the capacitor, while FIG. 3C is a cross-sectional view taken along the line 3c—3c of FIGS. 3A and 3B.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Integrated circuit devices are formed from doped regions in a semiconductor substrate to which source or drain connections are made with source and drain electrodes. The source and drain electrodes are separated by a gate control region. The gate control region is created by forming a gate electrode comprising polysilicon or metal over a thin gate oxide formed over the semiconductor substrate. Metal connection to the source, gate, and drain electrodes are made by multiple layers of metal interconnects known in the art as multilayer interconnects. Each of these layers of metal interconnects is supported over the semiconductor substrate by an interlayer dielectric.

Figure 1A:
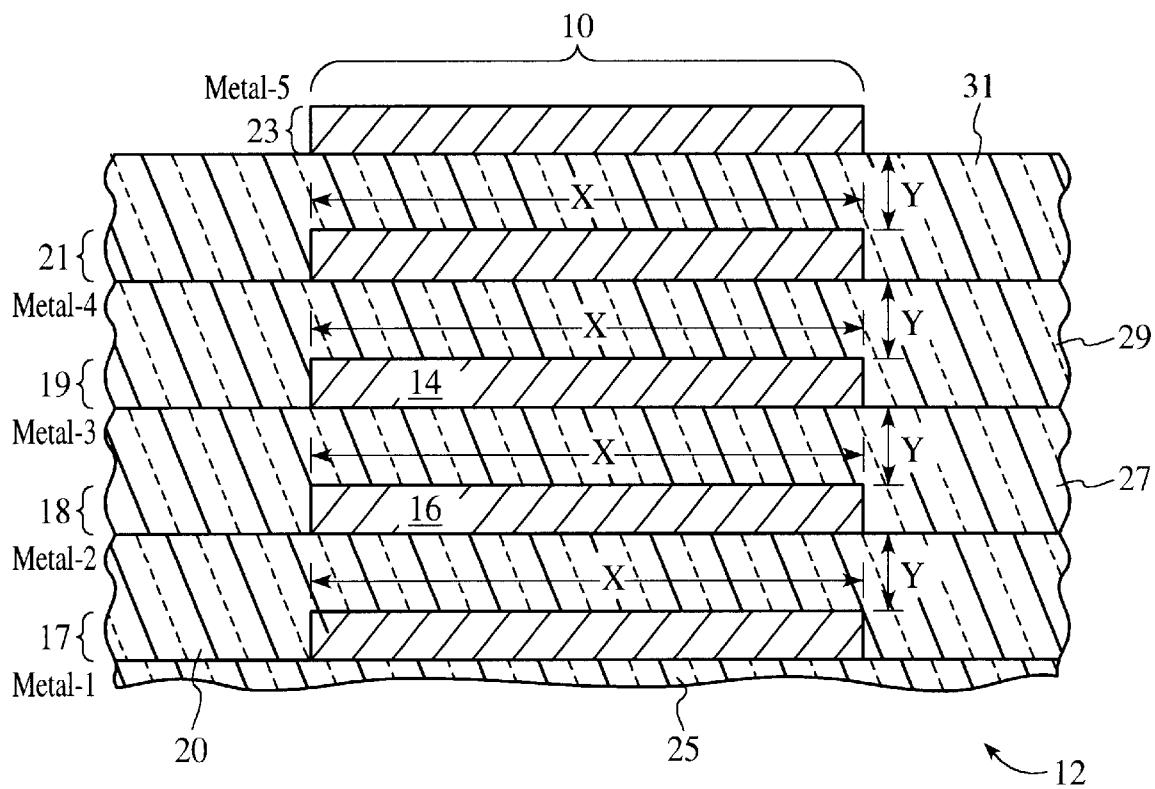
FIGS. 1A and 1B, respectively, are a cross-sectional view depicting a capacitor formed using prior art techniques.

Direct connection to the source, gate, and drain electrodes is made by a first layer of metal interconnects. Typically, as shown in FIG. 1A, such interconnect formation is preceded by formation of a dielectric layer 25 which covers all underlying conductive regions in order to prevent shorts to the first layer of metal interconnects. A layer of metal is deposited on the dielectric layer and patterned to form the first layer 17 of metal interconnects. This dielectric layer 25 is conventionally referred to as first interlayer dielectric and the layer of metal 17 is conventionally referred to as first metal layer 17 or metal-1.

Additional layers of metal interconnects are formed from additional layers of metal 18,19,21 and 23. Each additional layer of metal 18,19,21 and 23 is separated by an additional dielectric layer 20,27,29 and 31. Three to five such additional layers of metal 18,19,21 and 23 are typically employed in present integrated circuits. These additional layers of metal are conventionally referred to in sequential order as second metal layer 18, third metal layer 19, fourth metal layer 21, and fifth metal layer 23, alternatively designated, metal-2, metal-3, metal-4, and metal-5, respectively.

Each layer of metal (e.g. metal-3) is capacitively coupled to adjacent layers of metal (e.g., metal-2 and metal-4). Capacitive coupling between different layers of metal separated by an interlayer dielectric is referred to as interlayer capacitance. By taking advantage of interlayer capacitive coupling, capacitors may be constructed using metallization techniques conventionally used to form multilayer interconnect. A capacitor 10 is formed directly above the first line of metal (metal-1) 17 comprising a first line of metal 16 corresponding to metal-2 18 and a second line of metal 14 corresponding to metal-3 19.

Figure 1B:
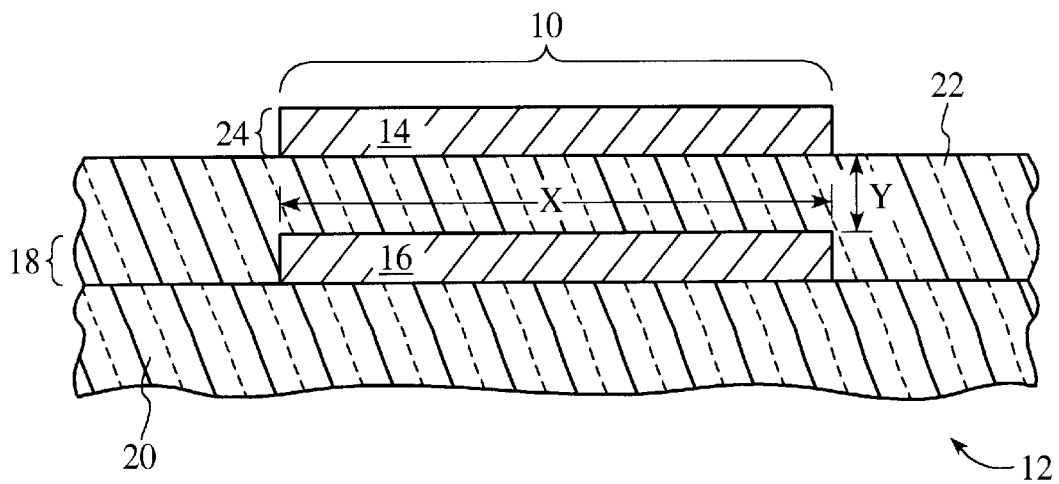

Referring now to FIG. 1B, wherein like reference numerals designate like elements throughout, a capacitor 10, formed using prior art techniques, is depicted. Accordingly, the capacitor in FIG. 1 is prior art, and is therefore not novel. In particular, FIG. 1 shows a cross-sectional view of a portion of an integrated circuit structure 12 having the capacitor 10 formed therein. The capacitor 10 comprises a second line of metal 14 formed directly above a first line of metal 16. The first line of metal or first line 16 is formed from a second metal layer (metal-2) 18 which is formed on a second interlayer dielectric 20. The second interlayer dielectric 20 resides on a first interlayer dielectric (not shown) which lies over a semiconductor substrate (also not shown). A third interlayer dielectric 22 surrounds the first line of metal 16. The second line of metal or second line 14 is patterned from a third metal layer (metal-3) 24 which is formed on the third interlayer dielectric 22.

The first line of metal 16 and the second line of metal 14, separated by the third interlayer dielectric 22, are not in direct electrical contact but are capacitively coupled. Accordingly, the pair of metal lines, i.e., the first line 16 and the second line 14, form a capacitor 10 analogous to a metal plate capacitor or a parallel plate capacitor. Advantageously, metal plate capacitors or parallel plate capacitors, which comprise metal plates separated by a spacer, have a capacitance which does not vary with applied voltage. The capacitance of this capacitor 10 is based on interlayer capacitive coupling since the first line of metal 16 and the second line of metal 14 are formed from separate metal layers, namely, the second metal layer (metal-2) 18 and the third metal layer (metal-3) 24, respectively.

The value of capacitance, C, for a parallel plate capacitor is approximated by the formula:

$$C = k\frac{A}{d}$$

where A is the area of the metal plates calculated by multiplying the length and width of the metal plates, d is the separation between the metal plates, and k is a constant which includes therein the dielectric constant of the region between the metal plates. Analogously, for the capacitor 10 shown in FIG. 1, the width of the first line of metal 16 and the second line of metal 14 which overlap each other corresponds to X, while the separation between the first line and the second line is Y. The length of the pair of metal lines 16 and 14 is not depicted in the cross-sectional view of the portion of the integrated circuit structure 12 provided in FIG. 1. Accordingly, the capacitance per unit length between the first line of metal 16 and the second line of metal 14 is approximated by $$k\frac{X}{Y}.$$

For example, the width X of the first line 16 and the second line 14 may correspond to 0.875 μm and the separation Y may correspond to 0.7 μm. Such dimensions are consistent with integrated circuit technology having a minimum feature size of 0.25 μm. For a capacitor 10 having a capacitance derived from interlayer capacitive coupling which has the above described dimensions, the capacitance per unit length between the pair of metal lines 16 and 14 is approximated by $$k\frac{0.875}{0.7}$$

or equivalently 1.25k.

However, in present integrated circuits, particularly digital integrated circuits, the spacing between metal lines in the same layer of metal is becoming smaller and smaller in order to accommodate higher packing densities. For conventional digital circuitry having sub-micrometer feature sizes, the metal pitch or the minimum spacing between metal lines is generally smaller than the thickness of the interlayer dielectric. Consequently, each metal line in a layer of metal is capacitively coupled to adjacent metal lines in that same layer of metal. Capacitive coupling between different metal lines formed in the same layer of metal is referred to as intralayer capacitance.

In accordance with the present invention, a capacitor 10 is constructed using metal lines formed from the same layer of metal thereby taking advantage of intralayer capacitive coupling. Since the minimum spacing between metal lines in the same metal layer is smaller than the spacing between different layers of metal, a higher value of capacitance is attainable by employing intralayer capacitance instead of interlayer capacitance. Accordingly, the capacitor 10 of the present invention, which is based on intra-layer capacitance, has a higher capacitance value for a given area on the integrated circuit structure 12 than capacitors formed using prior art techniques which are based on interlayer capacitance. With the capacitor 10 of the present invention, more capacitance is realized in a smaller area than is achievable in prior art capacitors.

Figure 2A:
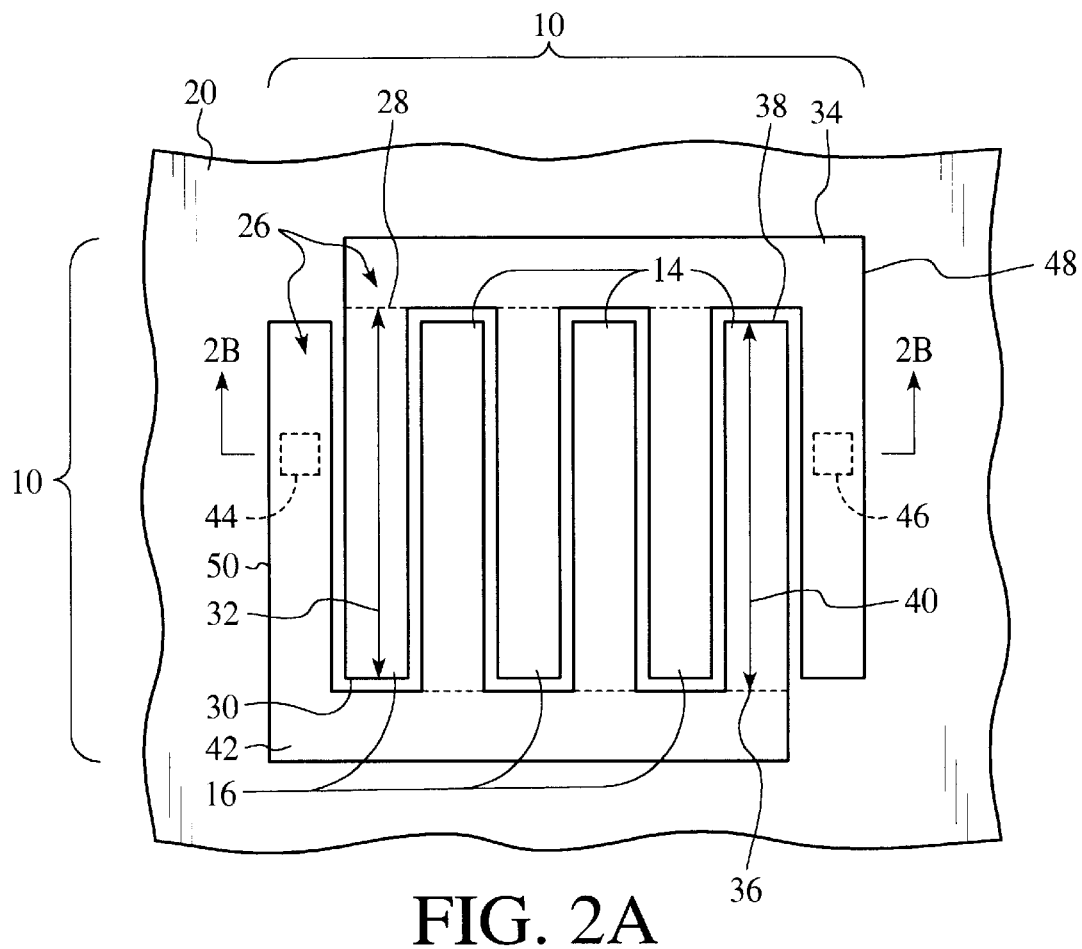
FIGS. 2A and 2B depict one embodiment of the capacitor of the present invention, where
Figure 2B:
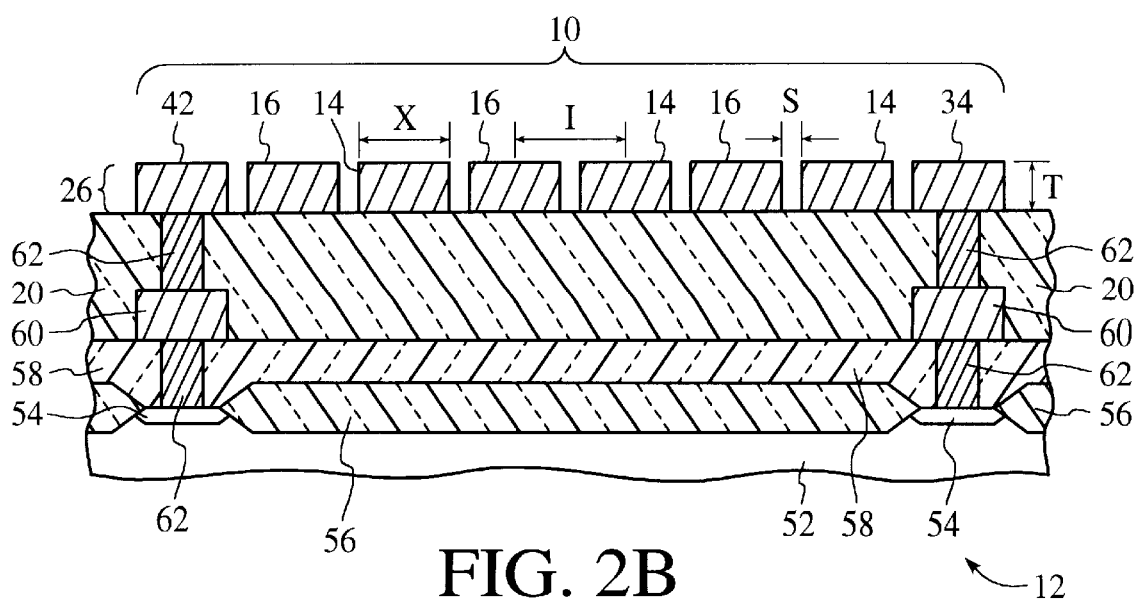

Referring now to FIGS. 2A–2B, one embodiment of the capacitor 10 of the present invention is depicted. FIG. 2A is a top plan view of the capacitor 10 while FIG. 2B is a cross-sectional view taken along the line 2b—2b of FIG. 2A.

The capacitor 10 of the present invention is formed by patterning a first layer of metal 26. The first layer of metal 26 may comprise metal conventionally employed in integrated circuitry for constructing conducting lines. Examples of metals suitably employed in the capacitor 10 of the present invention include aluminum, copper, silver, and alloys thereof The first layer of metal 26 is patterned using techniques conventionally employed in the fabrication of integrated circuits and may include damascene metallization techniques.

FIG. 2A depicts the capacitor 10 having a plurality of first lines 16 each having two ends 28 and 30 and a length 32 therebetween. Although three such first lines 16 are shown it will be appreciated that in fact any number of such first lines may be employed. The plurality of first lines 16 are arranged such that the lengths 32 of each of the first lines are parallel. A first connecting electrode 34 is connected to one end 28 of each of the first lines 16. Each of the first lines 16 is electrically isolated except for the connection formed with the first connecting electrode 34.

Also shown is a plurality of second lines 14 each having two ends 36 and 38 and a length 40 therebetween. The plurality of second lines 14 is arranged such that the lengths 40 of the second lines are parallel to the lengths 32 of the first lines 16. Although three such second lines 14 are shown it will be appreciated that in fact any number of such second lines may be employed. The first lines 16 and the second lines 14 are arranged in alternating order such that no two first lines are adjacent and no two second lines are adjacent. A second connecting electrode 42 is connected to one end 36 of each of the second lines 14. Each of the second lines 14 is electrically isolated except for the connection formed with the second connecting electrode 42. Such a scheme wherein two sets of metal lines are meshed together is conventionally referred to as a set of "interdigitated fingers". In this case, the first lines 16 and the second lines 14 correspond to the fingers. Accordingly, the plurality of first lines 16 and the plurality of second lines 14 are said to be interdigitated.

As shown in FIG. 2A, the first lines 16 and the second lines 14 are formed on an insulating layer (second interlayer dielectric) 20. Electrical contact with the first connecting electrode 34 and the second connecting electrode 42 are made at contact points 44 and 46. It will be appreciated, however, that the contact points 44 and 46 may be located elsewhere on the first connecting electrode 34 and the second connecting electrode 42, respectively. In this embodiment of the present invention a portion 48 of the first connecting electrode 34 is adjacent to one of the second lines 14 thereby contributing additional capacitance to the capacitor 10. Similarly, a portion 50 of the second connecting electrode 42 is adjacent to one of the first lines 16. However, it will be additionally appreciated that the first connecting electrode 34 and the second connecting electrode 42 may be configured in a different manner.

Additionally, in FIG. 2A the lengths 32 and 40 of the first lines 16 and the second lines 14 are not shown to be significantly longer than the first connecting electrode 34 and the second connecting electrode 42. It will be appreciated, however, that the lengths 32 and 40 can be substantially longer than the first connecting electrode 34 and the second connecting electrode 42. In a preferred embodiment of the present invention, the length 32 of the first lines 16 and the length 40 of the second lines 14 are substantially longer than the first connecting electrode 34 and the second connecting electrode 42, respectively.

FIG. 2B depicts a cross-sectional view of the capacitor 10 of the present invention formed in a portion of an integrated circuit structure 12. The portion of the integrated circuit structure 12 contains a semiconductor substrate 52 having doped regions 54 formed therein. Field oxide regions 56 separate the doped regions 54 from each other. The first interlayer dielectric 58 electrically isolates the doped regions 54 from first metal layer 60. Electrical connection between the first metal layer 60 and the doped regions 54 is formed with metal plugs 62.

The second interlayer dielectric 20 is formed on the first metal layer 60. On top of the second interlayer dielectric 20, the first layer of metal 26 of the capacitor 10 is formed. This first layer of metal 26 of the capacitor 10 corresponds to the second metal layer or metal-2 18 of the portion of the integrated circuit structure 12 shown. Alternatively, the first layer of metal 26 of the capacitor 10 may be formed from the third metal layer (metal-3), the fourth metal layer (metal-4), or the fifth metal layer (metal-5). Preferably, the first layer of metal 26 of the capacitor 10 is formed from the fourth metal layer (metal-4) or the fifth metal layer (metal-5). The first lines 16 and the second lines 14 as well as the first connecting electrode 34 and the second connecting electrode 42 are patterned from the first layer of metal 26 of the capacitor 10, which in this case corresponds to the second metal layer (metal-2) 18. The metal plugs 62 complete the electrical connection between the first connecting electrode 34 and one of the doped regions 54 in the semiconductor substrate 52 and between the second connecting electrode 42 and another of the doped regions in the semiconductor substrate.

It will be appreciated that a layer of dielectric (not shown) may be deposited over the integrated circuit structure 12 at this stage of processing to electrically isolate the first layer of metal 26.

The first lines 16 are electrically isolated from the second lines 14. The first lines 16 and the second lines 14 are not in direct electrical contact but are capacitively coupled. Accordingly, the pair of metal lines 16 and 14 form a capacitor 10 analogous to a parallel plate capacitor. The capacitance of this capacitor 10 is derived from intra-layer capacitive coupling since the first lines 16 and the second lines 14 are formed from the same layer of metal, i.e., the first layer of metal 26.

As described above, since the minimum spacing between metal lines in the same metal layer is smaller than the spacing between different layers of metal, a higher value of capacitance is attainable by employing intralayer capacitance instead of interlayer capacitance. Accordingly, the capacitor 10 of the present invention can be the same size or can even be smaller in size than a capacitor formed by prior art techniques, yet have a larger value of capacitance. In particular, the capacitor 10 shown in FIGS. 2A–2B may occupy a portion of an integrated circuit structure 12 that is the same size as the capacitor shown in FIG. 1 but may also have a higher capacitance.

The formula which approximates the capacitance, C, for a parallel plate capacitor is given above as $$k\frac{A}{d}.$$

For the capacitor 10 of the present invention shown in FIGS. 2A–2B which is based on intralayer capacitive coupling between each of the first lines 16 and each of the second lines 14, the area A corresponds to the thickness of the metal lines shown as T multiplied by their length (not shown). The separation d is characterized by the spacing S between the first line 16 and the second line 14 shown in FIG. 2B. Accordingly, the capacitance per unit length between the first metal line 16 and the second metal line 14 is approximated by $$k\frac{T}{S}.$$

It will be appreciated that the formula C $$C = k\frac{A}{d}$$

is an approximation and is fairly accurate for the conventional parallel plate capacitor 10 shown in FIG. 1. For the capacitor 10 of the present invention, which is based upon intralayer capacitive coupling between metal lines on the same layer of metal, this formula is not completely accurate. However, the formula may be employed to provide a comparison between the prior art capacitor 10 and the capacitor of the present invention based on approximate values of capacitance.

For example, for a first line 16 and a second line 14 each having a width of 0.5 $\mu$m (shown as X in FIG. 2B), the spacing S between adjacent metal lines may correspond to 0.375 $\mu$m and the thickness T of the metal lines may be 0.8 $\mu$m. Such dimensions are consistent with integrated circuit technology having a minimum feature size of 0.25 $\mu$m. The capacitance per unit length between the pair of metal lines 16 and 14 for the capacitor 10 of the present invention having the above described dimensions is approximated by $$k\frac{0.8}{0.375}$$

or equivalently 2.13k. This value of capacitance per unit length is larger than the capacitance per unit length of the capacitor 10 formed by prior art techniques and depicted in FIG. 1; a value which is shown above as being approximately 1.25k.

However, the capacitor 10 of the present invention having the dimensions described above occupies the same area on the integrated circuit structure 12 as the capacitor formed by prior art techniques shown above. It will be appreciated that each of the metal lines (either the first line 16 or the second line 14) is surrounded by two adjacent metal lines. For any such given metal line, a capacitance per unit length equivalent to approximately 2.13k is associated with both adjacent metal lines. Consequently, each given metal line has a capacitance per unit length produced by interaction with both adjacent metal lines, the sum of which can be approximated as about twice 2.13k.

It will further be appreciated by those skilled in the art that to properly consider the capacitance per unit length between a given metal line and only one of the adjacent metal lines, an interval I (see FIG. 2B) which includes only half the width X of each adjacent metal line plus the separation therebetween should be considered when comparing the sizes of the capacitors 10. Accordingly, a capacitance per unit length of approximately 2.13k is associated with the interval I wherein the interval I comprises contributions of ½ X from both metal lines 16 and 14 (each 0.5 $\mu$m wide) and a separation therebetween of 0.375 $\mu$m. The resulting value of this interval I is 0.875 $\mu$m which is identical to the size of the capacitor 10 formed using prior art techniques that is considered above. Consequently, the area on the integrated circuit structure 12 occupied by both capacitors 10 considered above is the same. However, the capacitor 10 of the present invention has a larger capacitance than the capacitor formed by prior art techniques.

Figure 3A:
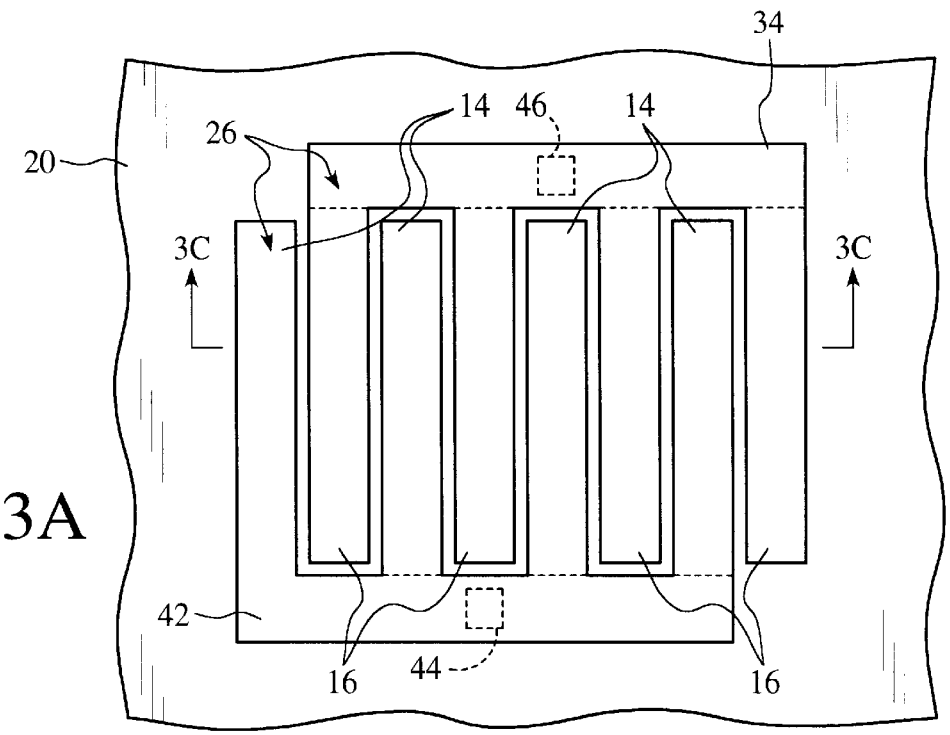
FIGS. 3A–3C depict an alternative embodiment of the capacitor of the present invention, where
Figure 3B:
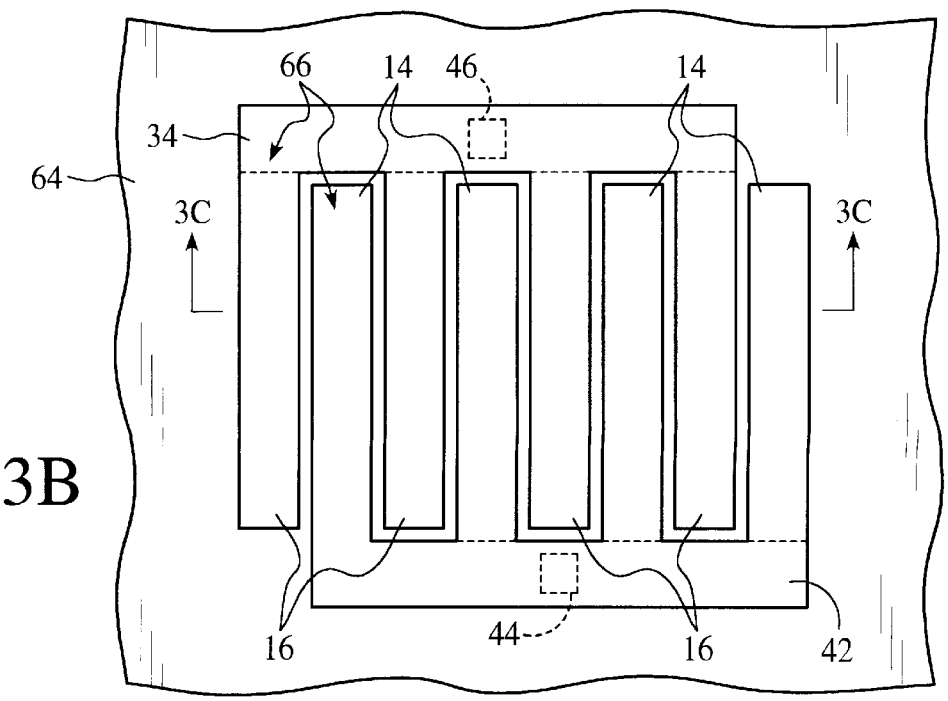
Figure 3C:
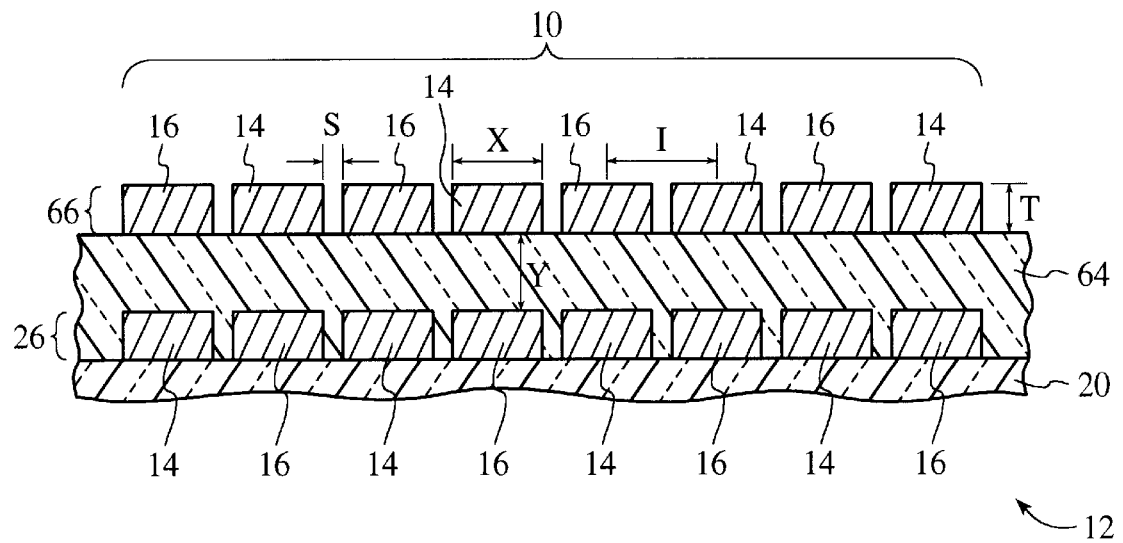

The capacitance per unit length of the capacitor 10 of the present invention can be further increased by taking advantage of both intralayer capacitance and interlayer capacitance. Such an alternative embodiment of the capacitor 10 of the present invention is depicted in FIGS. 3A–3C. Top plan views of the capacitor 10 are shown in FIGS. 3A and 3B. A cross-sectional view taken along the line 3c—3c of FIGS. 3A and 3B is shown in FIG. 3C.

In the second embodiment of the present invention, an additional insulating layer (third interlayer dielectric) 64 is formed on the first metal layer 26 and a second layer of metal (third metal layer or metal-3) 66 is formed on the additional insulating layer; see FIG. 3C. The second layer of metal 66 is patterned in a similar manner as the first layer of metal 26. Both the first layer of metal 26 and the second layer of metal 66 may comprise metal conventionally employed in integrated circuitry for constructing conducting lines. Examples of metals suitably employed in the capacitor 10 of the present invention include aluminum, copper, silver, and alloys thereof The second layer of metal 26 is patterned using techniques conventionally employed in the fabrication of integrated circuits and may include damascene metallization techniques.

Referring now to FIG. 3A, the first layer of metal 26 is depicted patterned into a plurality of first lines 16 connected to a first connecting electrode 34 and a plurality of second lines 14 connected to a second connecting electrode 42. The patterned first layer of metal 26 shown in FIG. 3A resembles the patterned first metal layer of the capacitor 10 shown in FIG. 2A corresponding to the first embodiment of the present invention. In FIG. 3A, however, the contact points 44 and 46 are positioned differently.

The second layer of metal 66 is patterned into a plurality of first lines 16 connected to a first connecting electrode 34 and a plurality of second lines 14 connected to a second connecting electrode 42. The patterned second layer of metal 66 shown in FIG. 3B is a mirror image the patterned first layer of metal 26 shown in FIG. 3A. In particular, the first lines 16 of the second layer of metal 66 are formed directly above the second lines 14 of the first layer of metal 26. Similarly, the second lines 14 of the second layer metal 66 are formed directly above the first lines 16 of the first layer of metal 26.

The cross-sectional view of the capacitor 10 of the second embodiment of the present invention is depicted in FIG. 3C. The first layer of metal 26 of the capacitor 10 which corresponds to second metal layer (metal-2) 18 of the portion of the integrated circuit structure 12 is shown formed on the second interlayer dielectric 20. The second interlayer dielectric 20 resides on the first interlayer dielectric (not shown) which lies over the semiconductor substrate (also not shown). On top of the first layer of metal 26 of the capacitor 10 is formed the third interlayer dielectric 64; the second layer of metal 66 is formed thereon. Metal plugs (not shown) complete the electrical connection between the first connecting electrode 34 of the first layer of metal 26 and the first connecting electrode of the second layer of metal 66. Metal plugs (not shown) also connect the second connecting electrode 42 of the first layer of metal 26 and the second connecting electrode of the second layer of metal 66.

It will be appreciated that a layer of dielectric (not shown) may be deposited over the integrated circuit structure 12 at this stage of processing to electrically isolate the second layer of metal 66.

The capacitance for an interval I of the capacitor 10 of the second embodiment can be computed in a similar manner as described above. For the capacitor 10 of the second embodiment contributions to the capacitance originate from the intralayer capacitive coupling between the first lines 16 and the second lines 14 in both the first layer of metal 26 and the second layer of metal 66 as well as interlayer capacitance between the first layer of metal and the second layer of metal.

The capacitance per unit length arising from the intralayer capacitive coupling approximately equals $$k\frac{T}{S}.$$

For the example described above the relevant parameters include the following: the width X of each first line 16 and each second line 14 is 0.5 μm, the spacing S between adjacent metal lines is 0.375 μm, and the thickness T of the first layer of metal 26 and the second layer of metal 66 is 0.8 μm. As described above, the capacitance per unit length between a given pair of metal lines 16 and 14 for either the first layer of metal 26 or the second layer of metal 66 (for the above described dimensions) is approximated by $$k\frac{0.8}{0.375}$$

or equivalently 2.13k. Accordingly, for the interval I containing a pair of metal lines 16 and 14 formed in each the first layer of metal 26 as well the second layer of metal 66, the capacitance per unit length due to intra-layer capacitive coupling is approximately twice 2.13k.

The capacitance per unit length arising from the interlayer capacitive coupling is describe above as approximately equal to $$k\frac{X}{Y}.$$

The variable X corresponds to the width of the first lines 16 and the second lines 14 which overlap. The variable Y corresponds to the separation between the first layer of metal 26 and the second layer of metal 66. For the interval I, X is twice 0.25 μm (0.25 μm for each metal line) and Y is 0.7 μm. Thus, the capacitance per unit length over the interval I due to the interlayer icapacitive coupling corresponds to approximately $$k\frac{2(0.25)}{0.7}.$$

Contributions to the value of capacitance over the interval I include interlayer capacitive coupling between (i) the first line 16 (first layer of metal 26) and the second line 14 (second layer of metal 66) and between (ii) the second line 14 (first layer of metal) and the first line 16 (second layer of metal 66).

The sum of the capacitance per unit length due to both the intralayer capacitive coupling and the interlayer capacitive coupling over the interval I is approximated by $$2(2.13k) + k\frac{2(0.25)}{0.7}$$

or equivalently 4.98k. In contrast, for the capacitor 10 based on prior art techniques which relies on interlayer capacitive coupling alone (see FIG. 1) and which is equivalent in size, the capacitance per unit length is shown above to be 1.25k. Accordingly, a total increase of about fourfold in capacitance is obtained with the capacitor 10 of the present invention over the conventional capacitor employing two layers of metal covering an equivalent portion of an integrated circuit structure 12. This example is based on integrated circuit technology having a minimum feature size of 0.25 μm. It will be appreciated, however, that the capacitor 10 of the present invention is applicable to integrated circuit technology having any minimum feature size but is advantageously applied to current IC technology having a minimum feature size of 0.5 or 0.35 μm, as well as 0.25 μm.

In the second embodiment of the invention described above, the first layer of metal 26 and the second layer of metal 66 were shown to corresponds to the second metal layer (metal-2) 18 and the third metal layer (metal-3). Alternatively, the first layer of metal 26 and the second layer of metal 66 may be formed from the third metal layer (metal-3) and the fourth metal layer (metal-4), respectively, or the fourth metal layer (metal-4) and the fifth metal layer (metal-5), respectively. Preferably, the first layer of metal 26 and the second layer of metal 66 comprise the fourth metal layer (metal-4) and the fifth metal layer (metal-5). By using one of the top metal layers, e.g., the fourth metal layer (metal-4) and the fifth metal layer (metal-5) to form the capacitor 10, only a small parasitic capacitance to the semiconductor substrate 52 or ground is encountered.

Figure 4:
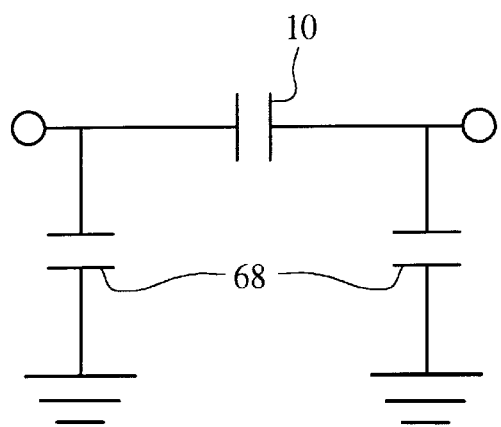
FIG. 4 is a schematic representation of the capacitive coupling of the capacitor of the present invention to ground.

FIG. 4 shows a schematic representation of the capacitive coupling of the capacitor 10 to ground. The parasitic capacitive coupling to ground is represented by the capacitors 68. If the first lines 16 and the second lines 14 are formed from upper metal layers such as the fourth metal layer (metal-4) and the fifth metal layer (metal-5), respectively, then the capacitance of the capacitor 10 of the present invention is advantageously large with respect to capacitive coupling to the semiconductor substrate 52. Typically, each metal layer is separated by 0.7 $\mu$m. Accordingly, the fourth metal layer (metal-4) and the fifth metal layer (metal-5) are separated from the semiconductor substrate by at least about 2.8 and 3.5 $\mu$m, respectively, in comparison to a separation of 0.7 and 1.4 $\mu$m, for the first metal layer (metal-1) and the second metal layer (metal-2). Consequently, the capacitive coupling of the fourth metal layer (metal-4) and the fifth metal layer (metal-5) to ground will be reduced compared, for example, to the capacitive coupling of the first metal layer (metal-1) and the second metal layer (metal-2) to ground. Alternatively, the first layer of metal 26 and the second layer of metal 66 may be formed from the third metal layer (metal-3) and the fourth metal layer (metal-4).

As described above, in the second embodiment of the invention two layers of metal, in particular, the first layer of metal 26 and the second layer of metal 66, are used to provide additional capacitance which originates from interlayer capacitive coupling between the two layers of metal. However, the capacitor of the present invention is not limited to two layers of metal. Additional levels, each comprising a metal layer, may be employed to provide additional capacitance. Each additional layer of metal is separated by an additional insulating layer. For example, three or four layers of metal may be used to form the capacitor of the present invention.

The same process as describe above for forming the second layer of metal 66 over the first layer of metal 26 can be employed to form each additional layer of metal over an underlying layer of metal. In this case, the underlying layer of metal may correspond to the second layer of metal 66 or an additional layer of metal.

The capacitor 10 of the present invention is fabricated with processes conventionally employed to fabricate digital circuitry; yet this capacitor and the method of making same will find use in analog applications. As described above, for conventional digital circuitry having sub-micrometer feature sizes, the metal pitch or spacing between metal lines in the same layer of metal are smaller than the separation between different layers of metal. Accordingly, the capacitance that can be achieved with the capacitor 10 of the present invention which employs intralayer capacitance is higher than can be obtained with conventional capacitors employing interlayer capacitance which occupy the same area on a semiconductor wafer.

The advantages of the capacitor 10 of the present invention include the following:

(1) A capacitance can be achieved which is higher than can be obtained with conventional capacitors occupying an area on the integrated circuit structure 12 which is the same size;

(2) Conventional processes for fabricating digital circuitry can be employed to form the capacitor 10 of the present invention;

(3) Small capacitors 10 can be produced thereby improving packing density;

(4) The capacitance does not vary with applied voltage;

(5) When the capacitor 10 is formed from upper metal layers such as metal-3, metal-4, and metal-5, the parasitic capacitance to ground is small;

(6) Since the capacitance to ground is smaller with the capacitor 10 of the present invention, a signal can be maintained at higher frequencies resulting in increase operating speed and an improved signal to noise ratio; and (7) Improved efficiency is also achieved as the ratio of capacitance intended to be provided, versus parasitic capacitance, is higher for the capacitor 10 of the present invention compared to prior art capacitors.

INDUSTRIAL APPLICABILITY

The capacitor 10 of the present invention is expected to find use in the fabrication of deep sub-micrometer IC technology.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A capacitor formed in an integrated circuit device having a semiconductor substrate and a plurality of layers of metal, said plurality of layers of metal including a first metal layer (metal-1), a second metal layer (metal-2), a third metal layer (metal-3), a fourth metal layer (metal-4), and a fifth metal layer (metal-5) which are formed on top of each other over said semiconductor substrate, said capacitor having a first level, said first level comprising an insulating layer formed over said semiconductor substrate and a first layer of metal formed thereon, said first layer of metal being patterned to form:

(a) a plurality of first lines each having two ends and a length therebetween;

(b) a first connecting electrode connected to one end of each of said first lines, each of said first lines electrically isolated except for said connection formed with said first connecting electrode;

(c) a plurality of second lines each having two ends and a length therebetween arranged such that said plurality of first lines and said plurality of second lines are interdigitated; and (d) a second connecting electrode connected to one end of each of said second lines, each of said second lines electrically isolated except for said connection formed with said second connecting electrode;

wherein said insulating layer has a thickness, and said first lines and said second lines which are adjacent have a spacing therebetween that is smaller than said thickness of said insulating layer, and wherein said first layer of metal corresponds to one of said plurality of layers of metal formed over said semiconductor substrate, said one of said plurality of layers of metal being selected from the group consisting of said metal-1, said metal-2, said metal-3, said metal-4, and said metal-5.

2. The capacitor of claim 1 wherein said first layer of metal comprises a metal selected from the group consisting of aluminum. Copper, silver, and alloys thereof.

3. The capacitor of claim 1 wherein said lengths of said first lines and said second lines are substantially longer than said first connecting electrode and said second connecting electrode.

4. The capacitor of claim 1 additionally comprising a second level, said second level comprising (i) an additional insulating layer formed on said first metal layer and having a thickness, and (ii) a second layer of metal formed on said additional insulating layer and patterned to form:
   (a) a plurality of first lines each having two ends and a length therebetween;
   (b) a first connecting electrode connected to one end of each of said first lines, each of said first lines electrically isolated except for said connection formed with said first connecting electrode;
   (c) a plurality of second lines each having two ends and a length therebetween arranged such that said plurality of first lines and said plurality of second lines are interdigitated; and
   (d) a second connecting electrode connected to one end of each of said second lines, each of said second lines electrically isolated except for said connection formed with said second connecting electrode;
   wherein said first lines and said second lines of said second layer of metal which are adjacent have therebetween spacing that is smaller than said thickness of said insulating layer and said thickness of said additional insulating layer, and
   wherein each of said first lines of said second layer of metal are formed directly above said second lines of said first layer of metal and said second lines of said second layer of metal are formed directly above said first lines of said first layer of metal, and
   wherein said first connecting electrode of said first layer of metal is electrically connected to said first connecting electrode of said second layer of metal and said second connecting electrode of said first layer of metal is electrically connected to said second connecting electrode of said second layer of metal.

5. The capacitor of claim 4 wherein said second layer of metal corresponds, but not simultaneously similarly as said first layer of metal, to one of said plurality of layers of metal, said one of said plurality of layers of metal being selected from the group consisting of said metal-1, said metal-2, said metal-3, said metal-4, and aid metal-5.

6. The capacitor of claim 5 wherein said first layer of metal corresponds to metal-3 and said second layer of metal corresponds to metal-4 or said first layer of metal corresponds to metal-4 and said second layer of metal corresponds to metal-5.

7. The capacitor of claim 4 wherein said first layer of metal and said second layer of metal comprise metals selected from the group consisting of aluminum, copper, silver, and alloys thereof.

8. The capacitor of claim 4 wherein both in said first layer of metal and in said second layer of metal said lengths of said first lines and said second lines are substantially longer than said first connecting electrode and said second connecting electrode.

9. The capacitor of claim 1 additionally comprising a plurality of additional levels formed on said first layer of metal, each one of said plurality of additional levels comprising (i) an additional insulating layer formed on an underlying metal layer and having a thickness, and (ii) an additional layer of metal formed on said additional insulating layer and patterned to form:
   (a) a plurality of first lines each having two ends and a length therebetween;
   (b) a first connecting electrode connected to one end of each of said first lines, each of said first lines electrically isolated except for said connection formed with said first connecting electrode;
   (c) a plurality of second lines each having two ends and a length therebetween arranged such that said plurality of first lines and plurality of second lines are interdigitated; and
   (d) a second connecting electrode connected to one end of each of said second lines, each of said second lines electrically isolated except for said connection formed with said second connecting electrode;
   wherein said first lines and said second lines of said additional layer of metal which are adjacent have therebetween spacing that is smaller than said thickness of said insulating layer and said thickness of said additional insulating layer in any of said additional levels; and
   wherein each of said first lines of said additional layer of metal are formed directly above said second lines of said underlying layer of metal and said second lines of said additional layer of metal are formed directly above said first lines of said underlying layer of metal, and
   wherein said first connecting electrode of said underlying layer of metal is electrically connected to said first connecting electrode of said additional layer of metal and said second connecting electrode of said underlying layer of metal is electrically connected to said second connecting electrode of said additional layer of metal.

10. The capacitor of claim 9 wherein, both in said first layer of metal and in said additional layer of metal in each of said plurality of additional levels, said lengths of said first lines and said second lines are substantially longer than said first connecting electrode and said second connecting electrode.

11. The capacitor of claim 9 wherein, each of said first layer of metal and said additional layer of metal in each of said plurality of additional levels formed on said first layer of metal corresponds, but not simultaneously similarly, to one of said plurality of metal layers, said one of said plurality of metal layers being selected from the group consisting of said metal-1, said metal-2, said metal-3, said metal-4, and said metal-5.

12. A capacitor formed in an integrated circuit device having a semiconductor substrate and a plurality of layers of metal, said plurality of layers of metal including a first metal layer (metal-1), a second metal layer (metal-2), a third metal layer (metal-3), a fourth metal layer (metal-4), and a fifth metal layer (metal-5) which are formed on top of each other over said semiconductor substrate, said capacitor comprising a first level, said first level comprising an insulating layer formed over said semiconductor substrate and having a thickness, and a first layer of metal formed thereon, said first layer of metal being patterned to form:
   (a) a first line having two ends and a length;
   (b) a first connecting electrode connected to one end of said first line, said first line electrically isolated except for said connection formed with said first connecting electrode;
   (c) a second line having two ends and a length arranged such that said length of said second line is substantially parallel to said length of said first line; and (d) a second connecting electrode connected to one end of said second line, said second line electrically isolated except for said connection formed with said second connecting electrode;

wherein said first line and said second line have a spacing therebetween that is smaller than said thickness of said insulating layer, and wherein said first layer of metal corresponds to one of said plurality of layers of metal, said one of said plurality of layers of metal being selected from the group consisting of said metal-1, said metal-2, said metal-3, said metal-4, and said metal-5.

13. A capacitor of claim 12 additionally comprising a second level, said second level comprising (i) an additional insulating layer formed on said first layer of metal and having a thickness, and (ii) a second layer of metal formed on said additional insulating layer and patterned to form:

(a) a first line having two ends and a length therebetween;

(b) a first connecting electrode connected to one end of said first line, said first line electrically isolated except for said connection formed with said first connecting electrode;

(c) a second line having two ends and a length therebetween arranged such that said length of said second line is substantially parallel to said length of said first line; and (d) a second connecting electrode connected to one end of said second line, said second line electrically isolated except for said connection formed with said second connecting electrode.

wherein said first line and said second line have a spacing therebetween that is smaller than said thickness of said insulating layer and said thickness of said additional insulating.

14. The capacitor of claim 13 wherein said first layer of metal and said second layer of metal comprise metals selected from the group consisting of aluminum, copper, silver, and alloys thereof.

15. The capacitor of claim 13 wherein both in said first layer of metal and said second layer of metal said lengths of said first lines and said second lines are substantially longer than said first connecting electrode and said second connecting electrode.

16. The capacitor of claim 13 wherein said second layer of metal corresponds, but not simultaneously similarly as said first layer of metal, to one of said plurality of layers of metal, said one of said plurality of layers of metal being selected from the group consisting of said metal-1, said metal-2, said metal-3, said metal-4, and said metal-5.

17. The capacitor of claim 12 wherein said first layer of metal comprises metal selected from the group consisting of aluminum, copper, silver, and alloys thereof.

18. The capacitor of claim 12 wherein said lengths of said first line and said second line are substantially longer than said first connecting electrode and said second connecting electrode.

* * * * *